United States Patent
Bellanger et al.

(10) Patent No.: US 10,841,643 B2
(45) Date of Patent: Nov. 17, 2020

(54) METHOD OF RECORDING ADAPTIVE TO THE DEGREE OF WEAR OF THE STORAGE MEDIUM

(71) Applicant: SAGEMCOM BROADBAND SAS, Rueil-Malmaison (FR)

(72) Inventors: Julien Bellanger, Rueil Malmaison (FR); Anthony Cammas, Rueil Malmaison (FR)

(73) Assignee: SAGEMCOM BROADBAND SAS, Rueil Malmaison (FR)

( * ) Notice: Subject to any disclaimer, the term of this patent is extended or adjusted under 35 U.S.C. 154(b) by 0 days.

(21) Appl. No.: 16/479,863

(22) PCT Filed: Dec. 14, 2017

(86) PCT No.: PCT/EP2017/082904
§ 371 (c)(1),
(2) Date: Jul. 22, 2019

(87) PCT Pub. No.: WO2018/137845
PCT Pub. Date: Aug. 2, 2018

(65) Prior Publication Data
US 2020/0177949 A1    Jun. 4, 2020

(30) Foreign Application Priority Data
Jan. 26, 2017  (FR) .................................... 17 50651

(51) Int. Cl.
*H04N 9/88* (2006.01)
*H04N 21/433* (2011.01)
*H04N 19/40* (2014.01)
*H04N 21/439* (2011.01)
*H04N 21/4402* (2011.01)
*H04N 21/4425* (2011.01)

(52) U.S. Cl.
CPC .......... *H04N 21/4334* (2013.01); *H04N 19/40* (2014.11); *H04N 21/4398* (2013.01); *H04N 21/4425* (2013.01); *H04N 21/440218* (2013.01)

(58) Field of Classification Search
CPC .......... H04N 21/4334; H04N 21/4425; H04N 21/4398; H04N 21/440218; H04N 19/40
USPC ......................... 386/263, 264, 270, 326, 248
See application file for complete search history.

(56) References Cited

U.S. PATENT DOCUMENTS

| 6,801,536 B1 * | 10/2004 | Foster ............... H04L 29/06027 |
| | | 348/E5.007 |
| 9,135,185 B2 | 9/2015 | Loh et al. |
| 2005/0080497 A1 | 4/2005 | Rao |
| 2008/0147910 A1 | 6/2008 | Hibbard et al. |

FOREIGN PATENT DOCUMENTS

EP    2 709 110 A1    3/2014

* cited by examiner

*Primary Examiner* — Robert Chevalier
(74) *Attorney, Agent, or Firm* — Muncy, Geissler, Olds & Lowe, P.C.

(57) ABSTRACT

Method for recording a received stream such as an audio and/or video stream, the recording method including the steps: of evaluating the wear of a storage medium intended to record the received stream; of calculating as a function of the wear an optimal stream bitrate making it possible to increase a lifetime of the storage medium; of adapting the received stream so as to record it at the optimal stream bitrate.

20 Claims, 3 Drawing Sheets

METHOD OF RECORDING ADAPTIVE TO THE DEGREE OF WEAR OF THE STORAGE MEDIUM

The invention relates to the field of recording methods used for performing a time-shifting function.

BACKGROUND OF THE INVENTION

Time-shifting makes it possible to watch or listen to a broadcast program a little later than its time of broadcast.

Time-shifting consists in recording a stream on a storage medium (e.g. a hard disk or a solid state drive (SSD), or an embedded multimedia controller (eMMC) memory) by making use of a circular buffer. When the circular buffer is full, the oldest data from the stream is replaced by the most recent data from the stream. The size of the circular buffer and the data rate of the stream thus define the length of time that is available for time-shifting.

The stream may be an audio stream, a video stream, or indeed an audio and video stream.

The stream may be broadcast in numerous ways, and for example via satellite, via terrestrial digital television (TDT), via a cable, or via an Internet protocol (IP) network. Broadcasting via the IP network itself makes use of techniques known as streaming, HTTP live streaming (HLS), progressive downloading, etc.

The stream may be received by various types of receiver clients, and by way of example by a set-top box, a computer, a tablet, a mobile telephone, etc.

It should be observed that other systems operate on a similar principle, and in particular video surveillance systems.

One of the difficulties confronting the designers of time-shifting solutions relates to wear of the storage medium.

The storage media used for time-shifting, and in particular those comprising flash memory, present a relatively small number of write/delete cycles. Flash memory includes a reserve of unused memory blocks. Once the storage medium begins to wear, the reserve of unused memory blocks dwindles. The software stored in the storage medium therefore has fewer unused memory blocks available for writing entries such as a user preferences, or indeed for updating the software.

OBJECT OF THE INVENTION

An object of the invention is to reduce premature wear of a storage medium due to using a function of the time-shifting type.

SUMMARY OF THE INVENTION

In order to achieve this object, there is provided a method of recording a received stream such as an audio and video stream, the method being used to enable a function of the time-shifting type to be performed, the recording method comprising the steps:
  of evaluating wear of a storage medium for recording the received stream;
  of calculating, as a function of the wear, an optimum stream data rate for increasing the lifetime of the storage medium;
  of adapting the received stream so as to record it at the optimum stream data rate.

By adapting the received stream to the optimum stream data rate, the lifetime of the storage medium is increased.

There is also provided a set-top box including processor means arranged to perform the recording method as described above.

There are also provided a computer program including instructions for enabling equipment of the set-top box type to perform the recording method as described above.

There is also provided storage means, characterized in that they store a computer program containing instructions for enabling equipment of the set-top box type to perform the recording method as described above.

Other characteristics and advantages of the invention appear on reading the following description of a particular, non-limiting embodiment of the invention.

BRIEF DESCRIPTION OF THE DRAWINGS

Reference is made to the accompanying drawings, in which.

DETAILED DESCRIPTION OF THE INVENTION

The recording method of the invention is performed in this example in a set-top box.

The set-top box comprises processor means comprising a processor, a storage medium, an Ethernet port, a high-definition multimedia interface (HDMI) port, and an infrared port.

The set-top box is connected to a broadcast network, specifically the Internet, via its Ethernet port. The set-top box is also connected to a TV set via its HDMI port, and it is controlled by a remote control via its infrared port.

The set-top box receives a received stream from an external server via its Ethernet port, which stream is specifically an audio and video stream. The set-top box transforms the received stream into an audio and video stream compatible with the TV set. The audio and video stream is transmitted to the TV set via the HDMI port, and is played back in the form of programs played back on the screen of the TV set.

A user watching a broadcast program and deciding to make use of the time-shifting function can use the remote control to cause the set-top box to perform the time-shifting function. The set-top box then records the audio and video stream in the storage medium in order to enable the user to watch the broadcast program later on.

The recording method of the invention is performed each time the set-top box leaves a standby mode. It would also be possible to perform the recording method of the invention at other times, e.g. each time the set-top box is switched on, each time the user makes use of the time-shifting function, or indeed at predefined time intervals (once a day, once a week, once a month, etc.).

Figure 1:
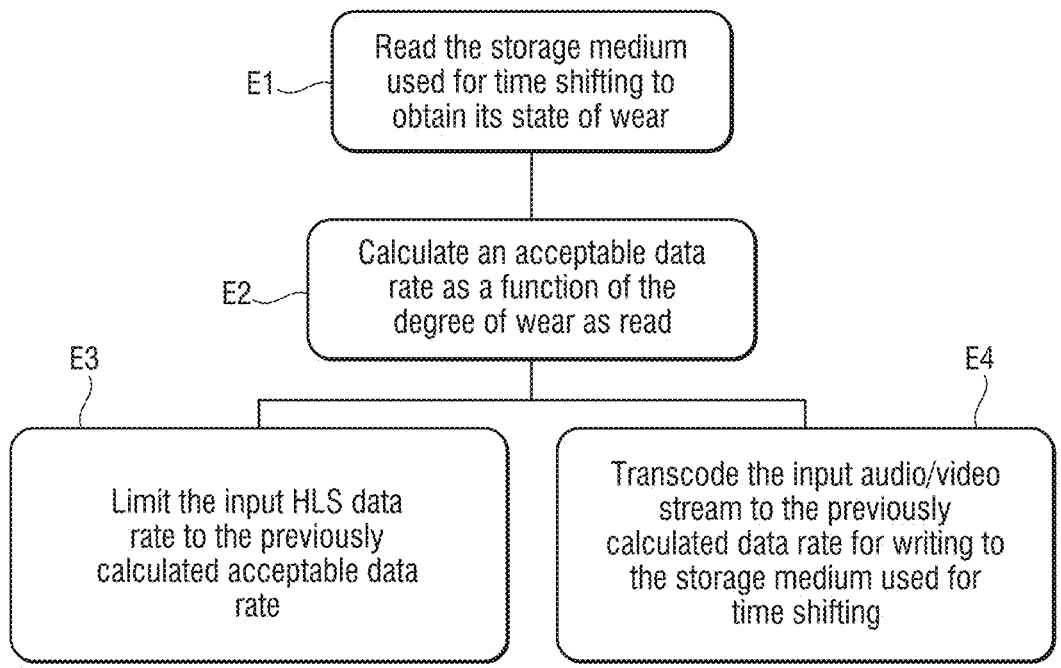
FIG. 1 shows the steps of the recording method of the invention.

With reference to FIG. 1, the recording method of the invention consists initially in evaluating wear of the storage medium (step E1). Evaluating the wear of the storage medium comprises acquiring, from the storage medium, a wear parameter that is representative of the wear of the storage medium. In this example, the wear parameter is a degree of wear, expressed without units and as a percentage in the range 0 to 100%. The storage medium stores information corresponding to the degree of wear in an internal register. The degree of wear is thus accessible by reading the internal register.

Thus, when the storage medium comprises an eMMC memory, the information corresponding to the degree of wear is stored in the internal registers known as Extended CSD 268 and Extended CSD 269. These internal registers are defined by the JEDEC standard JESD84, and they specify the degree of wear in steps of 10%.

By way of example, other storage media enable the number of write/delete cycles to be read. Under such circumstances, the wear parameter is the number of write/delete cycles.

It should be observed that it is possible to optimize the evaluation of the wear of the storage medium by adapting the wear parameter to the real wear conditions that apply to the storage medium. Specifically, the manufacturers of storage media tend to define wear parameters, such as the above-mentioned degree of wear, while including a safety margin. The evaluated wear is thus greater than the real wear of the storage medium. It is then possible, when performing the recording method of the invention to reduce the wear parameter so that it corresponds to real wear of the storage medium.

The recording method of the invention then consists in using the wear to calculate an optimum stream data rate for increasing the lifetime of the storage medium (step E2). The optimum stream data rate is a data rate that is less than or equal to the data rate of the received stream, and it serves to optimize both the quality of the time-shifted playback of the broadcast program and to reduce the wear of the storage medium.

The optimum stream data rate may be calculated using several techniques.

Figure 2:
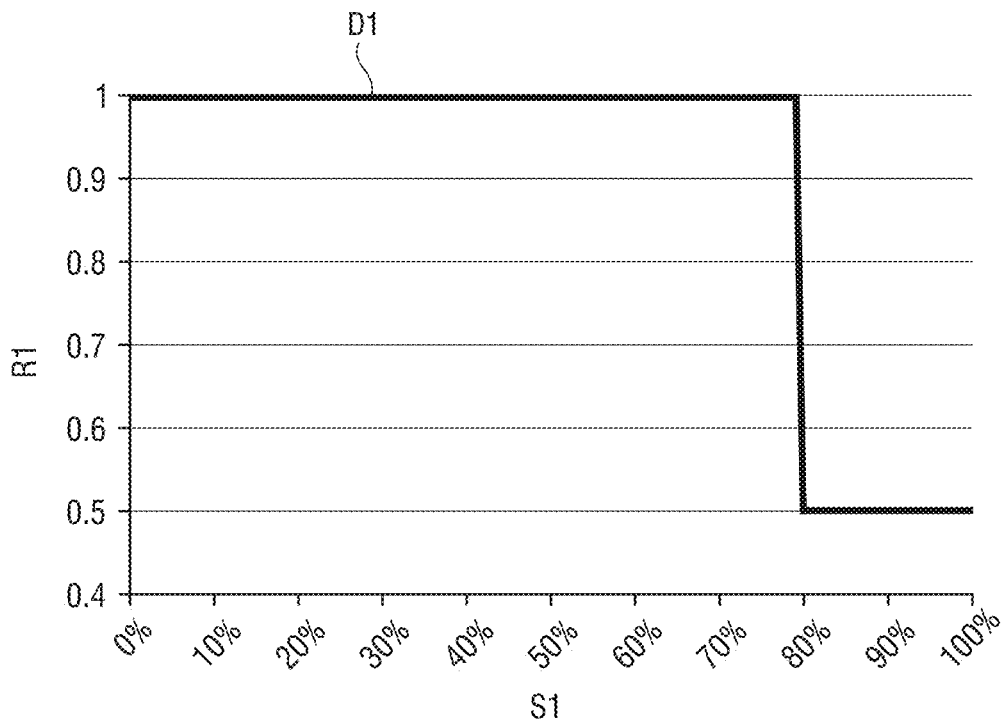
FIG. 2 is a graph plotting a curve for stream optimum data rate as a function of wear of a storage medium, the stream optimum data rate being calculated using a first technique.

In a first technique, and with reference to FIG. 2, the optimum stream data rate D1 is equal to the data rate of the received stream so long as the wear of the storage medium (specifically the degree of wear) is less than or equal to a predetermined wear threshold S1, and it is equal to the data rate of the received stream multiplied by a predetermined limiting ratio R1 when the wear of the storage medium (specifically the degree of wear) is greater than the predetermined wear threshold S1, the predetermined limiting ratio R1 lying in the range 0 to 1.

In FIG. 2, the predetermined wear threshold S1 is equal to 80% and the predetermined limiting ratio R1 is equal to 0.5. This first technique makes it possible for the user to benefit from time-shifted playback of the broadcast program at a maximum data rate (i.e. maximum playback quality) for a long period.

Figure 3:
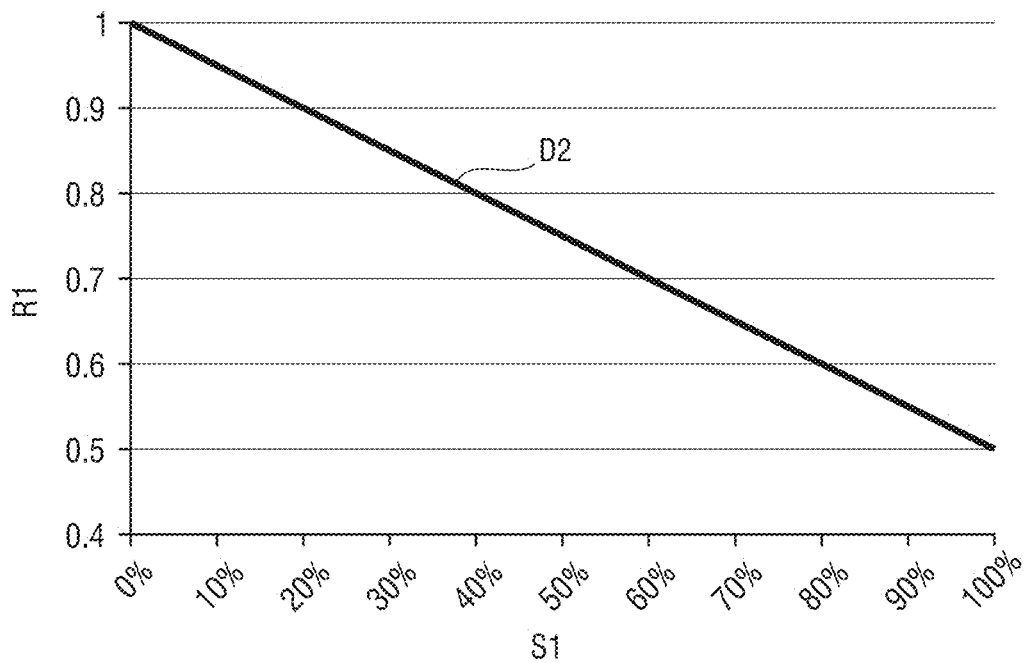
FIG. 3 is a graph plotting a curve for stream optimum data rate as a function of wear of a storage medium, the stream optimum data rate being calculated using a second technique.

In a second technique, and with reference to FIG. 3, the optimum stream data rate D2 is a linear function of the wear of the storage medium (specifically of the degree of wear).

This second technique enables the user to benefit from time-shifted playback of the broadcast program with the best relationship between the data rate (or the quality of playback) and the lifetime of the storage medium (or reduction in the wear of the storage medium).

Figure 4:
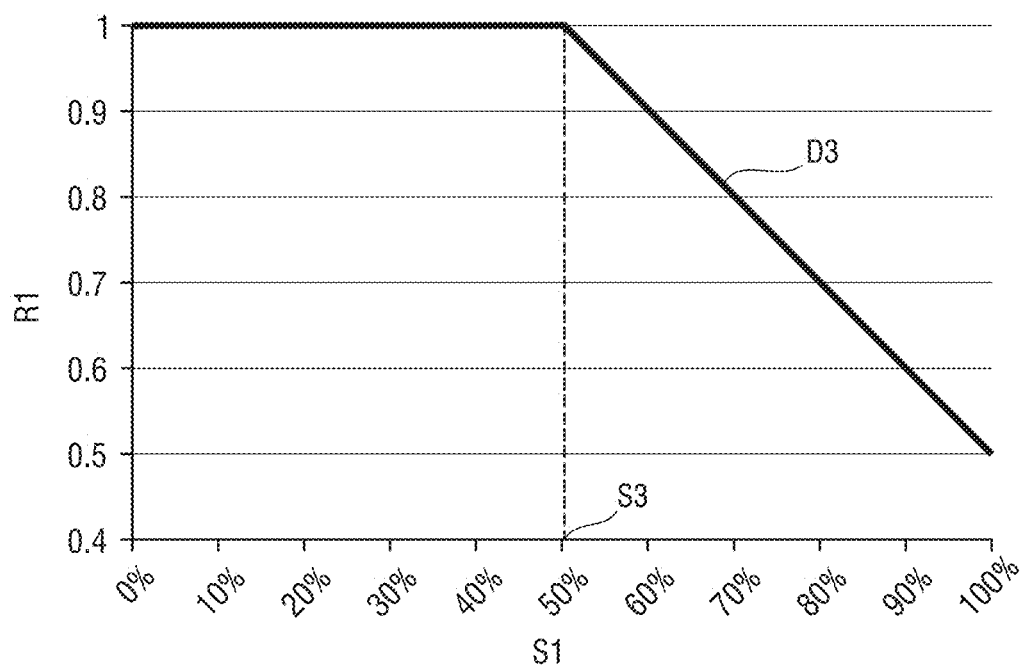
FIG. 4 is a graph plotting a curve for stream optimum data rate as a function of wear of a storage medium, the stream optimum data rate being calculated using a third technique.

In a third technique, and with reference to FIG. 4, the optimum stream data rate D3 is equal to the data rate of the received stream so long as the wear of the storage medium is less than or equal to a predetermined wear threshold S3, and is a linear function of the wear of the storage medium from the moment it reaches a predetermined wear threshold.

In FIG. 4, the predetermined wear threshold S3 lies in the range 50% to 60%.

Three techniques are thus described above for calculating the optimum stream data rate.

A particular one of these three techniques may be selected by way of example at the time the set-top box is manufactured (i.e. before it is installed with the user), or indeed as a result of updating the software of the set-top box, or indeed personally by the user, etc.

Figure 5:
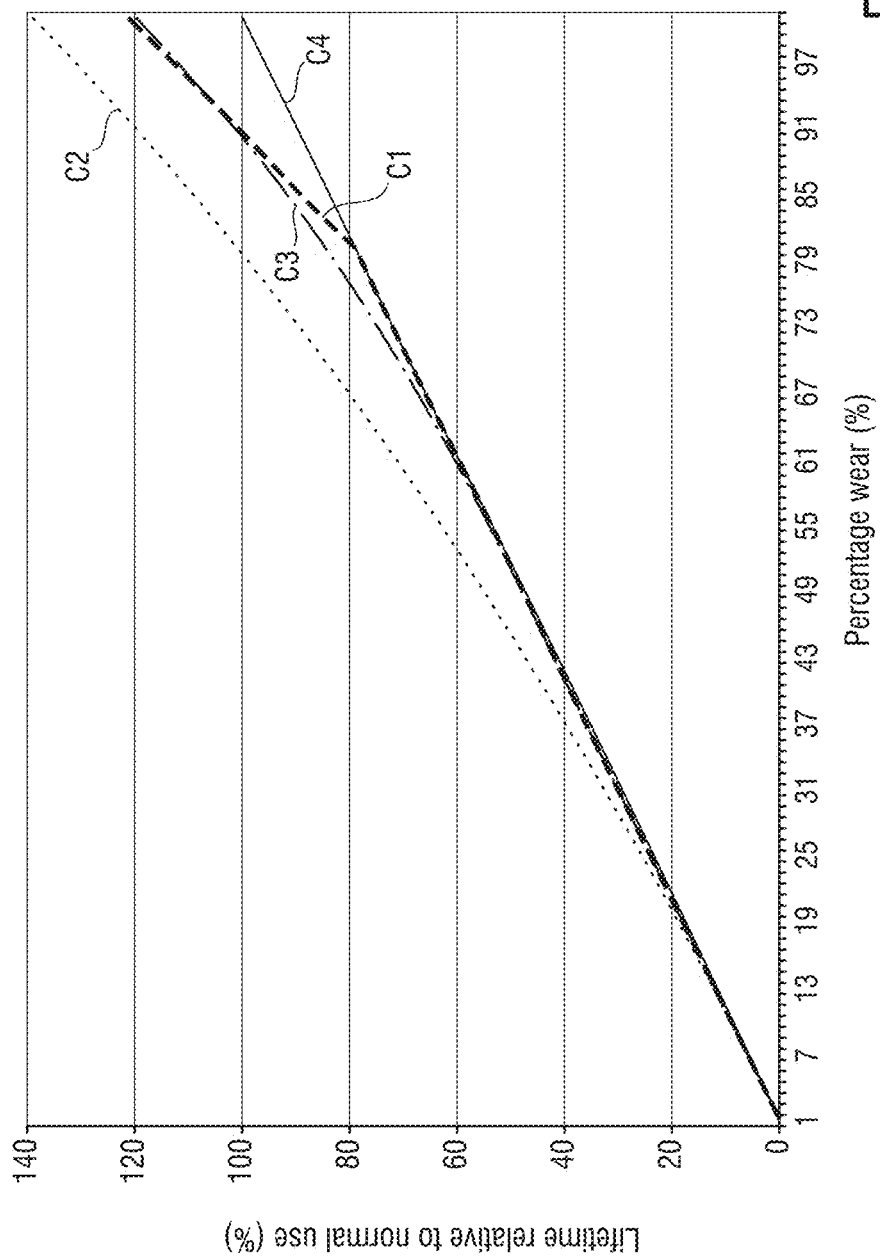
FIG. 5 is a graph plotting curves as a function of the degree of wear of the storage medium and showing for the first technique, for the second technique, and for the third technique the ratios between the lifetime of the storage medium when the recording method of the invention is performed and when the recording method of the invention is not performed.

The ratio between the lifetime of the storage medium when the recording method of the invention is performed, and the lifetime of the storage medium when the recording method of the invention is not performed, as a function of the wear of the storage medium, can be seen from FIG. 5: curve C1 corresponds to the first technique; curve C2 corresponds to the second technique; and curve C3 to the third technique. Curve C4, which is used as a reference, corresponds to the situation in which the recording method of the invention is not performed.

Thereafter, the recording method of the invention consists in adapting the received stream to obtain a stream that is recorded in the storage medium that presents the optimum stream data rate.

A first technique for adapting the received stream consists in adjusting the data rate of the received stream so that the data rate of the received stream, and thus of the recorded stream, is equal to the optimum stream data rate (step E3).

When the recording method of the invention is not performed, the external server transmits an audio and video stream using the transmission mechanisms as described below.

When transmitting an audio and video stream, the external server subdivides the corresponding video into segments, each having a duration of a few seconds (typically in the range 2 to 10 seconds). Each segment is stored on the external server in a plurality of versions, each version presenting a data rate that is different from the data rate of the other versions. The external several then sends to the set-top box a list of the video segments and of the data rate at which each segment is available. The set-top box requests the segments from the external server one by one. For each segment, the set-top box specifies a target data rate at which it desires the segments to be sent thereto. The external server then sends to the set-top box the version of the requested segment that corresponds to the data rate specified by the set-top box.

The set-top box then measures the time taken to receive each segment, and adjusts the target data rate that it requests for the following segments as a function of the time taken to receive the previous segments. Thus, if the time taken to receive a segment is longer than the duration of the segment, then the set-top box reduces the target data rate that it requests. In contrast, if the time taken to receive a segment is shorter than the duration of the segment, then the set-top box increases the target data rate that it requests.

In the context of performing the recording method of the invention, the set-top box specifies a target data rate to the external server. The target data rate is equal to the optimum stream data rate when that data rate is less than or equal to a maximum transfer data rate of the broadcast network over which the received stream passes, and the target data rate is equal to the maximum transfer data rate of the broadcast network when the optimum stream data rate is greater than the maximum transfer data rate of the broadcast network.

For example, when the audio and video stream presents a maximum data rate of 10 megabytes per second (MB/s), if the optimum stream data rate is equal to 5 MB/s and the performance of the network allows a maximum transfer data rate of 10 MB/s, the target data rate that is requested of the external server by the set-top box is equal to the optimum stream data rate, i.e. 5 MB/s.

In contrast, when the audio and video stream presents a maximum data rate of 10 MB/s, if the optimum stream data rate is equal to 10 MB/s and the performance of the network permits a maximum transfer data rate of 5 MB/s, then the target data rate that is requested of the external server by the set-top box is equal to the maximum transfer data rate made possible by the performance of the network, i.e. 5 MB/s.

Nevertheless, there exist situations in which the broadcast network does not allow the set-top box to adjust the data rate of the received stream. Thus, on a satellite broadcast network, the transmitter sends a single audio and video stream and the set-top box has no way of modifying the received stream. Under such circumstances, if the user seeks to watch a broadcast program live, without using the time-shifting function, then the set-top box does not modify the data rate of the received stream. The user thus benefits from maximum playback quality.

In contrast, if the user seeks to use the time-shifting function and if the data rate of the received stream is greater than the optimum stream data rate, then a second technique for adapting the received stream consists in transcoding the received stream so as to obtain a recorded stream in the storage medium at a data rate that is equal to the optimum stream data rate (step E4).

Several approaches can be used for transcoding the received stream in this second technique.

The transcoding may consist in acting on an audio stream contained in the received stream, on a video stream contained in the received stream, or indeed both on the audio stream and on the video stream.

When the audio stream comprises a plurality of audio tracks corresponding to a plurality of languages, the action on the audio stream may consist in eliminating one or more tracks corresponding to languages that are not desired by the user.

The action on the audio stream may also consist in reducing the number of channels in the audio tracks. For example, if one of the audio tracks contains six channels in "5.1 multichannel mode", then the set-top box may replace that audio track with a stereo track having two channels.

The action on the audio stream may also consist in using a codec to compress the audio stream, in adjusting the compression rate of a codec that is being used, or indeed in changing the codec in use so as to use a codec that provides a better compression ratio.

The action on the video stream may consist in reducing the resolution of the images in the video stream. For example, it is possible to go from resolution in the so-called "4K" digital image format (3840×2160 pixels) to a resolution in the so-called "HD" digital image format (1920×1080 pixels) by making use of bilinear redimensioning.

The action on the video stream may also consist in using a codec for compressing the video stream, in adjusting the compression ratio of the codec being used, or indeed in changing from using one codec to using a codec that provides a better compression ratio.

Naturally, some or all of these actions on the audio stream and on the video stream may be combined.

Two techniques are described above for adapting the received stream in order to obtain a recorded stream in the storage medium that presents the optimum stream data rate: a first technique consisting in adjusting the data rate of the received stream, and a second technique consisting in transcoding the received stream.

It should be observed that the first technique presents the drawback of being capable of being performed only when it is possible to act on the received stream, and the second technique presents the advantage of not reducing the quality of playback when the time-shifting function is not used.

Selection between the first and second techniques may be performed, by way of example, at the time the set-top box is manufactured (i.e. before it is installed with the user), or indeed as a function of the broadcast network to which the set-top box is connected, or indeed as a result of updating the software of the set-top box, or indeed personally by the user. This is also applicable to the various approaches that can be used for transcoding the received stream.

Naturally, the invention is not limited to the implementation described but covers any variant coming within the ambit of the invention as defined by the claims.

Although it is stated herein that the stream is received by a set-top box, it is possible to use some other receiver client, e.g. a computer, a tablet, a mobile telephone, etc.

The received stream is not necessarily an audio and video stream, but, by way of example, it could be an audio stream (only) or a video stream (only).

It is stated herein that the storage medium comprises an eMMC memory, however the invention naturally applies to any type of storage medium.

Above, the wear parameter that is representative of the wear of the storage medium is a degree of wear lying in the range 0 to 100%. It is entirely possible to use some other wear parameter, e.g. a degree of wear lying in the range 0 to 1, or a number of write/delete cycles.

In the first technique, the second technique, and the third technique for calculating the optimum stream data rate, the predetermined wear threshold and the predetermined ratio may be different from the values given. By way of example, the predetermined wear threshold may be equal to 50%, 60%, 75%, 80%, or 85%, or indeed may be taken between those values.

The invention does not apply solely to performing a time-shifting function, but to any function that makes use of a similar principle (e.g. a video surveillance function that enables the surveillance video tape to be viewed at a later time).

The invention claimed is:

1. A recording method for recording a received stream such as an audio and/or video stream, the recording method comprising the steps:
   of evaluating wear of a storage medium for recording the received stream;
   of calculating, as a function of the wear, an optimum stream data rate for increasing the lifetime of the storage medium;
   of adapting the received stream so as to record it at the optimum stream data rate.

2. The recording method according to claim 1, wherein the wear is evaluated by acquiring, from the storage medium, a wear parameter that is representative of the wear of the storage medium.

3. The recording method according to claim 2, further comprising a step of adapting the wear parameter so that it better characterizes real wear of the storage medium.

4. The recording method according to claim 2, wherein the wear parameter is a degree of wear lying in the range 0 to 1 or in the range 0 to 100%.

5. The recording method according to claim 2, wherein the wear parameter is a number of write/delete cycles.

6. The recording method according to claim 1, wherein the optimum stream data rate is equal to the data rate of the received stream when the wear of the storage medium is less than or equal to a predetermined wear threshold, and is equal to the data rate of the received stream multiplied by a predetermined limiting ratio when the wear of the storage medium is greater than the predetermined wear threshold, the predetermined limiting ratio lying in the range 0 to 1.

7. The recording method according to claim 1, wherein the optimum stream data rate is a linear function of the wear of the storage medium.

8. The recording method according to claim 1, wherein the optimum stream data rate is a linear function of the wear of the storage medium until the wear reaches a predetermined wear threshold.

9. The recording method according to claim 1, wherein the received stream is adapted by adjusting a data rate of the received stream so that the data rate of the received stream, and thus of the recorded stream, is equal to the optimum stream data rate.

10. The recording method according to claim 9, wherein the data rate of the received stream is adjusted by specifying a target data rate to an external server that generates the stream.

11. The recording method according to claim 10, wherein the target data rate is equal to the optimum stream data rate when that data rate is less than or equal to a maximum transfer data rate of a network over which the received stream passes, and wherein the target data rate is equal to the maximum transfer data rate of the network when the optimum stream data rate is greater than the maximum transfer data rate of the network.

12. The recording method according to claim 1, wherein the received stream is adapted by transcoding the received stream in order to obtain the recorded stream.

13. The recording method according to claim 12, wherein the transcoding consists in acting on an audio stream contained in the received stream.

14. The recording method according to claim 13, wherein the action on the audio stream consists in eliminating an audio track corresponding to a language that is not desired, and/or in reducing the number of channels in the audio tracks, and/or in adjusting a compression ratio of a codec, and/or in changing the codec being used.

15. The recording method according to claim 12, wherein the transcoding consists in acting on a video stream contained in the received stream.

16. The recording method according to claim 15, wherein the action on the video stream consists in reducing the resolution of images in the video stream, and/or in adjusting the compression ratio of a codec, and/or in changing the codec in use.

17. The recording method according to claim 1, used for performing a time-shifting type function.

18. The recording method according to claim 1, used for performing a video surveillance function.

19. A set-top box including processor means arranged to perform the recording method according to claim 1.

20. A non-transitory computer-readable storage device, wherein the non-transitory computer-readable storage device stores a computer program containing instructions for enabling equipment of the set-top box type to perform the recording method according to claim 1.

* * * * *